United States Patent
Sumida et al.

(10) Patent No.: US 8,933,325 B2
(45) Date of Patent: Jan. 13, 2015

(54) SOLAR CELL MODULE

(75) Inventors: Kenichiro Sumida, Omihachiman (JP); Akihito Ito, Ise (JP); Mitsuo Yamashita, Omihachiman (JP); Hiroaki Hirata, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 209 days.

(21) Appl. No.: 13/574,568

(22) PCT Filed: Jan. 21, 2011

(86) PCT No.: PCT/JP2011/051094
§ 371 (c)(1),
(2), (4) Date: Jul. 20, 2012

(87) PCT Pub. No.: WO2011/090160
PCT Pub. Date: Jul. 28, 2011

(65) Prior Publication Data
US 2012/0279560 A1 Nov. 8, 2012

(30) Foreign Application Priority Data

Jan. 21, 2010 (JP) .................. 2010-010782
Jul. 30, 2010 (JP) .................. 2010-172357

(51) Int. Cl.
*H01L 31/042* (2014.01)
*H02N 6/00* (2006.01)
*F16B 11/00* (2006.01)

(52) U.S. Cl.
CPC .......... *H01L 31/042* (2013.01); *H01L 31/0422* (2013.01); *F16B 11/006* (2013.01); *Y02E 10/50* (2013.01)
USPC ....................................... 136/251

(58) Field of Classification Search
None
See application file for complete search history.

(56) References Cited

U.S. PATENT DOCUMENTS

| 6,307,144 B1 * | 10/2001 | Mimura et al. ............... 136/244 |
| 2010/0132767 A1 * | 6/2010 | Miyamoto et al. .......... 136/251 |
| 2011/0226335 A1 * | 9/2011 | Naitoh et al. ................ 136/259 |

FOREIGN PATENT DOCUMENTS

| JP | H08-284351 A | 10/1996 |
| JP | 09148612 A * | 6/1997 |
| JP | H09-148612 A | 6/1997 |
| JP | H10-294485 A | 11/1998 |

(Continued)

OTHER PUBLICATIONS

International Search Report dated May 10, 2011, issued for International Application No. PCT/JP2011/051094.

*Primary Examiner* — Eli Mekhlin
(74) *Attorney, Agent, or Firm* — Procopio, Cory, Hargreaves & Savitch LLP

(57) ABSTRACT

A solar cell module is disclosed. The solar cell module includes a solar cell panel, first and second holding members, a reinforcing member. The panel includes a light-receiving surface, a non-light receiving surface, a first side part and a second side part. The first and second holding members hold the first and second side parts respectively. The reinforcing member is laid across the first and second holding member on a non-light receiving surface side. The adhesive is disposed between the non-light receiving surface and the reinforcing member. The reinforcing member includes a supporting part that is disposed with a gap with the non-light receiving surface and that supports the non-light receiving surface via the adhesive. The supporting part includes a first main surface, a second main surface and a through hole. At least one part of the adhesive is located within the through hole.

12 Claims, 15 Drawing Sheets

(56) References Cited

FOREIGN PATENT DOCUMENTS

| JP | 2005-150318 A | 6/2005 |
| JP | 2006-269608 A | 10/2006 |
| JP | 2009-135304 A | 6/2009 |
| WO | 2008/139610 A1 | 11/2008 |
| WO | WO 2010061878 A1 * | 6/2010 |

* cited by examiner

SOLAR CELL MODULE

FIELD OF ART

The present invention relates to a solar cell module.

BACKGROUND ART

One means of reducing the cost of a photovoltaic system is to increase the size of the solar cell modules. However, because a large solar cell module is subjected to high wind loading and accumulated snow loading, superior load-bearing characteristics are required.

In order to improve the load-bearing characteristics, various solar cell modules including a reinforcing member supporting the center thereof have been disclosed.

The Japanese Laid-open Patent Publication No. 2005-150318 discloses a solar cell module including a reinforcing member that is fitted between a solar cell panel and a frame. The reinforcing member is adhered to the rear surface of the solar cell panel with a silicone adhesive. In an arrangement such as this, because the adhesive must be coated onto the reinforcing member beforehand, high work accuracy are required to manufacturing workers.

The international publication No. WO2008/139610 pamphlet discloses a solar cell module in which a substantially center part of a frame is cut away, a mounting part for the reinforcing member being formed on the frame. In such a configuration, the strength of the frame decreases at the location of providing the reinforcing member, thereby being possible to occur breakage.

The Japanese Laid-open Patent Publication No. H9-148612 discloses a solar cell module in which a reinforcing member is fixed to a frame by screws from the rear surface side of the solar cell panel. In such a configuration, if the holding by the screws is insufficient and a load is applied, there was a risk of the screws falling out.

Additionally, Japanese Laid-open Patent Publication No. 2009-135304 discloses a solar cell module in which a reinforcing member is held to a frame by screws from the direction of the side surface of the solar cell panel. In such a configuration, it is necessary to adjust the reinforcing member to a length that comes into contact with the wall part of the frame, and there was a risk of the assembly process becoming troublesome.

SUMMARY OF THE INVENTION

One object of the present invention is to provide a solar cell module having a simple construction and superior productivity.

Another object of the present invention is to provide a solar cell module having a simple construction and superior load-bearing characteristics.

The solar cell module according to one embodiment of the present invention includes: a solar cell panel that includes a light-receiving surface, a non-light receiving surface that corresponds to the rear surface of the light-receiving surface, and a first side part and second side part that are located between the light-receiving surface and the non-light receiving surface and that also are not located in one and the same plane; a first holding member holding the first side part of the solar cell panel; a second holding member holding the second side part of the solar cell panel; a long reinforcing member installed across the first holding member and the second holding member on a non-light receiving surface side, and an adhesive disposed between the non-light receiving surface and the reinforcing member. The reinforcing member includes a supporting part that is disposed with a gap with the non-light receiving surface and that supports the non-light receiving surface of the solar cell panel via the adhesive. The supporting part includes: a first main surface located on the non-light receiving surface side; a second main surface that corresponds to the rear surface of the first main surface; and a through hole that passes from the first main surface to the second main surface. At least one part of the adhesive is located within the through hole.

In a solar cell module according to another embodiment of the present invention, the first holding member and the second holding member each further include a mounting part that protrudes inwardly in a space sandwiched between the first holding member and the second holding member and that also is linked to the reinforcing member. The mounting part includes a first surface that is located on the non-light receiving surface side and a second surface and that corresponds to the rear surface of the first surface. The reinforcing member includes a linking part that sandwiches the first surface and the second surface of the mounting part.

According to the solar cell module of the one embodiment of the present invention, because it is possible to inject the adhesive into the gap between the solar cell panel and the reinforcing member from the through hole, it is possible to adhere the reinforcing member and the solar cell panel together after mounting the reinforcing member to the holding members. For this reason, it is possible to control the thickness of the adhesive layer by the amount of adhesive injected while assembling the solar cell module, without the adhesive contaminating the other members. As a result, it is possible to improve the productivity of the solar cell module by a simple construction.

According to the solar cell module of the other embodiment of the present invention, by adopting a structure in which the mounting parts of the pair of holding members are sandwiched by the linking part of the reinforcing member, in addition to increasing the strength of the mounting parts of the holding members, it is possible to hold the reinforcing member and the holding members together securely. As a result, even if a load in a direction of either positive pressure or negative pressure acts on the solar cell panel, damage to the mounting parts of the holding members can be reduced, thereby improving the load-bearing characteristics of the solar cell module.

EMBODIMENTS FOR PRACTICING THE INVENTION

First Embodiment

The solar cell module 100 according to the first embodiment of the present invention will be described in detail, using FIG. 1 to FIG. 3.

Figure 1A:
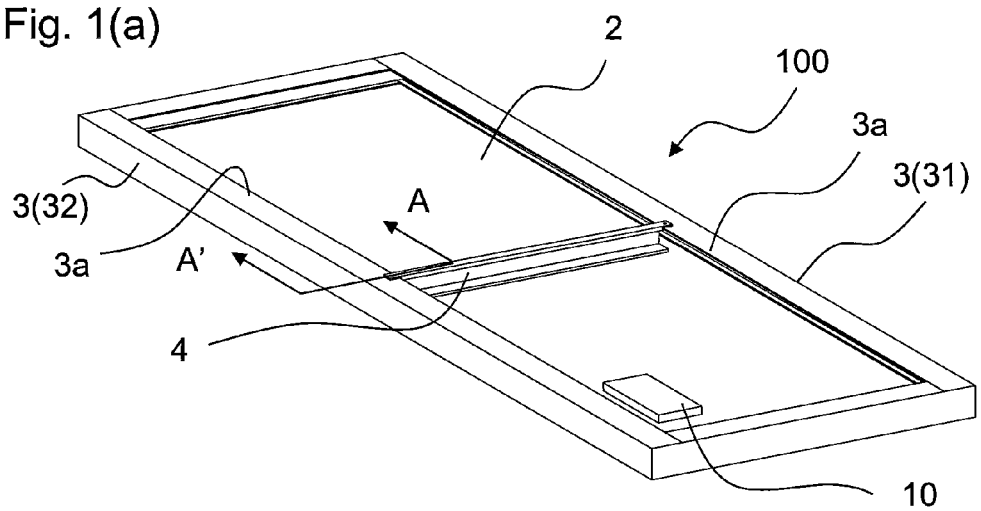
FIG. 1 is a group of drawings showing a solar cell module 100 according to a first embodiment of the present invention, FIG. 1(a) being an oblique view of the solar cell panel viewed from the non-light receiving surface, FIG. 1(b) being a cross-sectional view along the line A-A' of FIG. 1(a), and FIG. 1(c) being an oblique view of the reinforcing member in the solar cell module 100 of FIG. 1(a).

As shown in FIG. 1, the solar cell module 100 has a solar cell panel 2, a pair of holding members 3, a reinforcing member 4, and an adhesive 12. The pair of holding members 3 holds side parts at two locations on the solar cell panel 2 that are not mutually on the same side surface. The reinforcing member 4 is installed across between the pair of holding members 3. The solar cell panel 2 has a first side part and a second side part that are not mutually on the same plane. The pair of holding members 3 has a first holding member 31 holding the first side part and a second member 32 holding the second side part. In the present embodiment, as shown in FIG. 1(a), the first holding member 31 and the second holding member 32 are disposed so as to face each other. The reinforcing member 4 is linked to the holding members 3 so as to be installed across between the first holding member 31 and the second holding member 32, which face each other.

Figure 2:
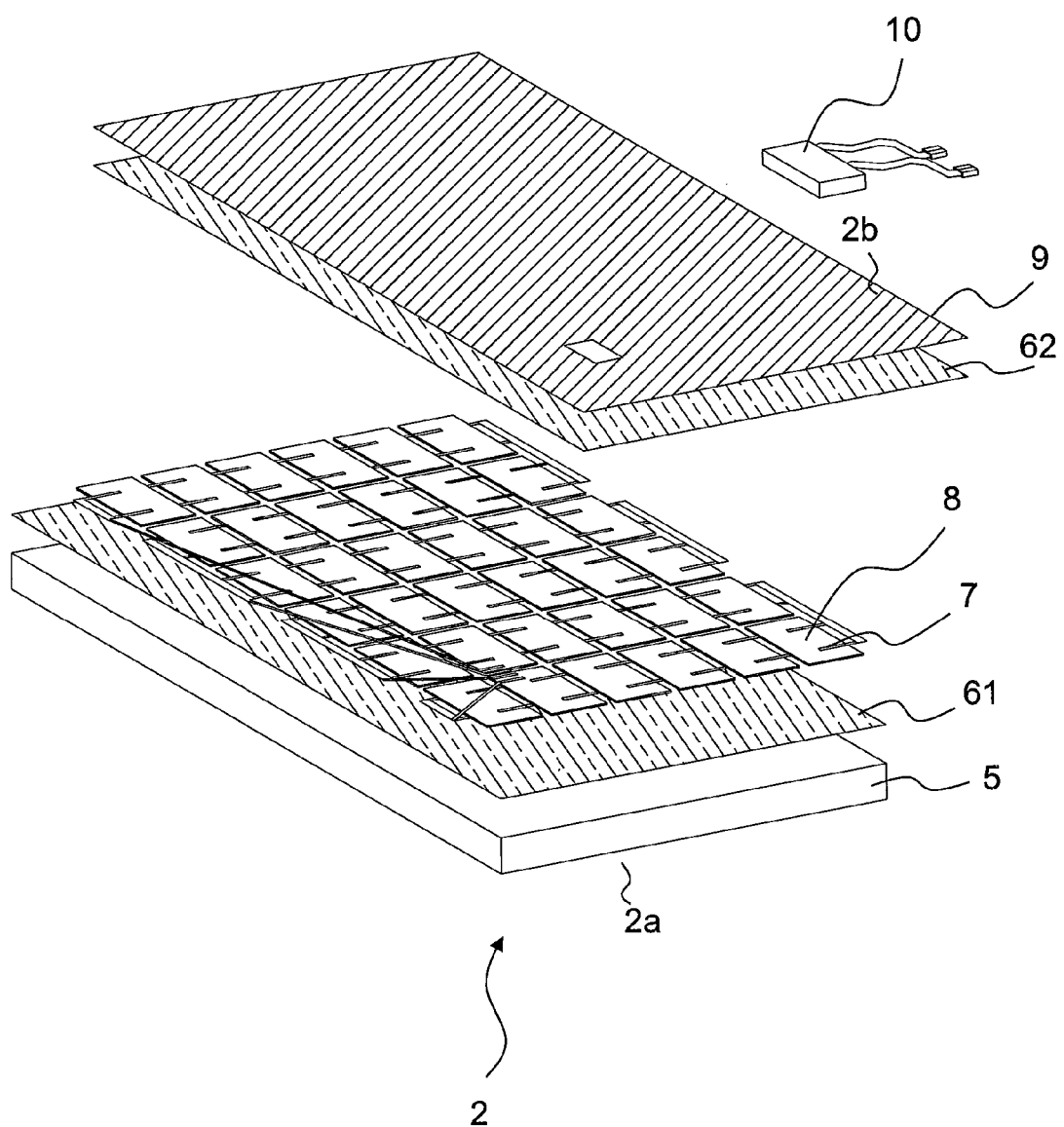
FIG. 2 is an exploded oblique view of a solar cell panel in the solar cell module 100 of FIG. 1(a).

As shown in FIG. 2, the solar cell panel 2 has, in sequence from a light-receiving surface 2a side, a translucent substrate 5, a light-receiving surface side filler material 61, a plurality of solar cell elements 8, a non-light receiving surface side filler material 62, a rear-surface protective film 9, and a terminal box 10. The translucent substrate 5 serves also as the substrate of the solar cell module 100, and the light-receiving surface side filter material 61 and the non-light receiving surface side filler material 62 are made of thermally cured resin. The plurality of solar cell elements 8 are protected in the area theresurrounding by a filler material 6, and are mutually electrically connected by inner leads 7. The rear-surface protective film 9 is for protecting the rear surface of the solar cell panel 2, and the terminal box 10 is adhered to the rear-surface protective film 9 and is for extracting the output to the outside.

The solar cell panel 2 has the light-receiving surface 2a (one main surface of the translucent substrate 5) that mainly receives light, and a non-light receiving surface 2b (one main surface of the rear-surface protective film 9) corresponding to the rear surface of the light-receiving surface 2a. Rather that not receiving any light at all, the non-light receiving surface 2b may be of a form that receives a part of the light incident from the non-light receiving surface 2b side. For example, by making the rear-surface protective film 9 and the non-light receiving surface side filler material 62 of a material that has translucency, it is possible to configure the non-light receiving surface 2b so as to receive light.

A sheet-like member made of, for example, single-crystal silicon or polycrystalline silicon is used as the solar cell elements 8. In the case of using a silicon substrate such as this, as described above, adjacent silicon substrates are electrically connected to each other by the inner leads 7. Alternatively, a thin-film solar cell, a chalcopyrite solar cell (including, for example, CIGS(Cu(In,Ga)Se$_2$), CISS(Cu(In,Ga)(Se,S)$_2$ and CIS(CuInS$_2$)), a CdTe solar cell, or a solar cell in which a thin-amorphous film is formed over a crystalline silicon substrate, or the like may be used as the solar cell element 8. The present embodiment is described as a form in which a polycrystalline silicon substrate is used.

Figure 1B:
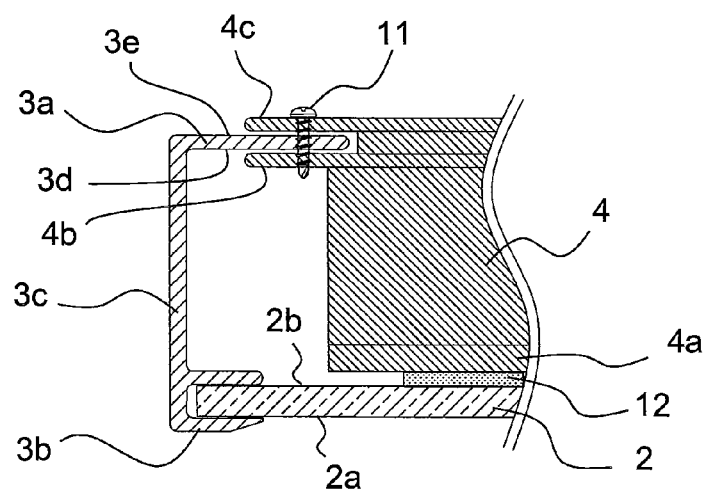

The holding members 3 are disposed at side surface parts of the solar cell panel 2, and have the function of holding the solar cell panel 2. These holding members 3, as shown in FIG. 1(b), include a mounting part 3a, a fitting part 3b, and a wall part 3c. The fitting part 3b is the part to which the solar cell panel 2 fits, and the wall part 3c extends perpendicularly with respect to a main surface (light-receiving surface 2a) of the solar cell panel 2, the mounting part 3a being a sheet-like part protruding from the wall part 3c toward the space surrounded by the holding member 3. In the following, the surface of the mounting part 3a facing the non-light receiving surface 2b side of the solar cell panel 2 is referred to as a first surface 3d, and the rear surface of the first surface 3d is referred to as a second surface 3e.

The holding members 3 can be made, for example, by the method of extruding aluminum or rolling steel sheet. Although in the present embodiment, the holding members 3 are a frame-like structure that holds the side part around the entire periphery of the solar cell panel 2, as long as it is possible to hold the solar cell panel 2, they may be a pair of rod-like structures so as to hold at least a pair of opposing side surface parts of the solar cell panel 2.

Figure 1C:
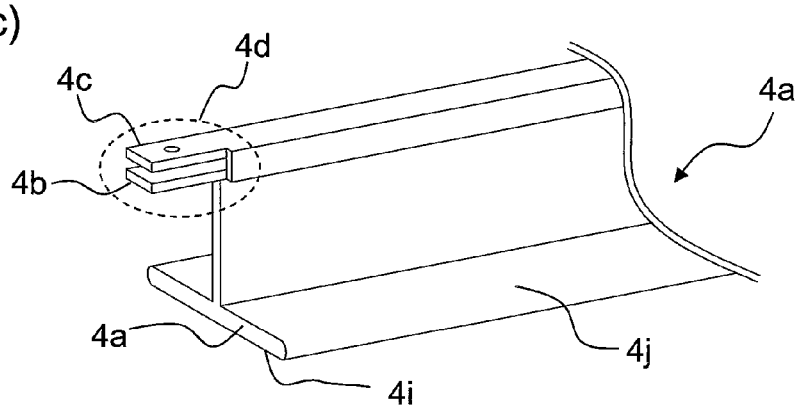

The reinforcing member 4 includes the function of improving the load-bearing characteristics of the solar cell panel 2. The reinforcing member 4, as shown in FIG. 1(b) and FIG. 1(c), supports the non-light receiving surface 2b of the solar cell panel 2 via the adhesive 12, and includes a supporting part 4a, a first member 4b and a second member 4c. The supporting part 4a is a part that supports the solar cell panel 2, and includes a first main surface 4i located on the non-light receiving surface 2b side and a second main side 4j corresponding to the rear surface of the first main surface 4i. The first member 4b is a part that makes contact with the first surface 3d of the holding member 3, and the second member 4c is a part that makes contact with the second surface 3e of the holding member 3. The first member 4b and the second member 4c are disposed in a bifurcated arrangement, so as to hold the mounting part 3a therebetween.

As shown in FIG. 1(c), the first member 4b and the second member 4c are combined to constitute a linking part 4d of the reinforcing member 4, and are linked to the mounting part 3a of the holding member 3. The linking part 4d, after being fitted together with the mounting part 3a of the holding member 3, is held together with the mounting part 3a by, for example, a screw 11, thereby fixing it to the holding member 3.

The reinforcing member 4 is long and establishes the distance between the opposing holding members 3 (between the first holding member 31 and the second holding member 32). By doing this, it is possible to reduce damaging of the solar cell panel 2 if it falls out of the fitting part 3b if the distance between the holding members 3 increases because of an applied load. Additionally, the reinforcing member 4 supports the non-light receiving surface 2b of the solar cell panel 2 so as to reduce the sagging of the solar cell panel 2, thereby enabling a reduction in the occurrence of cracks in the solar cell elements 8 within the solar cell panel 2.

The reinforcing member 4 can be made, for example, by the method of extruding aluminum or rolling a steel sheet. In this case, the cross-sectional shape of the reinforcing member 4 can be I-shaped, H-shaped, T-shaped, or L-shaped or the like. Square tubing or round tubing may also be arbitrarily selected as the reinforcing member 4, as appropriate to the application.

The adhesive 12 has the function of adhering the reinforcing member 4 to the solar cell panel 2, and is disposed between the non-light receiving surface 2b of the solar cell panel 2 and the reinforcing member 4. A silicone adhesive, a urethane resin adhesive or an epoxy resin adhesive, for example, can be used as the adhesive 12.

As described above, in the present embodiment, the solar cell panel 2 including the light-receiving surface 2a and the non-light receiving surface 2b, the pair of holding members 3 holding side parts at two locations of the solar cell panel 2, which are not mutually on the same side plane, and the reinforcing member 4 that is installed across between the pair of holding members 3 on the non-light receiving surface 2b side of the solar cell panel 2 are provided. The pair of holding members 3 includes the mounting part 3a that protrudes inwardly in a space sandwiched between the pair of the holding members and that also is linked to the reinforcing member 4. The mounting part 3a includes the first surface 3d that is located on the non-light receiving surface 2b side and the second surface 3e that corresponds to the rear surface of the first surface 3d. The reinforcing member 4 includes the linking part 4d that sandwiches the first surface 3d and the second surface 3e of the mounting part 3a. By the linking part 4d fitting to the mounting part 3a, the movement of first member 4b toward the non-light receiving surface 2b side is restricted, and also the movement of the second member 4c toward the light-receiving surface 2a side is restricted.

Because of this, it is possible to support a positive pressure load and a negative pressure load with respect to the solar cell module 1 (solar cell panel 2) by an assembled structure of the holding members 3 and the reinforcing member 4.

Also, for example, in the case of holding with the screw 11, a helical groove is formed in the mounting part 3a. In this case, in the present embodiment, because it is possible to distribute a load, which is applied to the mounting part 3 in the direction to pull the screw 11, to the first member 4b and the second member 4c, it is possible to improve the load-bearing characteristics of the solar cell module 1.

Also, in the present embodiment, even without extending the length of the helical groove and making the thickness of the mounting part 3a and the linking part 4d excessively large so as to improve the tightening strength, it is possible to increase the holding strength between the holding members 3 and the reinforcing member 4. For this reason, it is possible to save on materials for the holding members 3 and the reinforcing member 4, thereby enabling a cost reduction.

Additionally, in the present embodiment, the linking part 4d has a bifurcated structure. Because of this, as shown in FIG. 3, by causing the reinforcing member 4 to rotate within the space sandwiched between the holding members 3, it is easy to cause the linking part 4d to fit with the mounting parts 3a and hold them with the screws 11. By doing this, it is easy to install the reinforcing member 4 as a retrofit to a solar cell module 1 that has already been sold in the marketplace, and to install the reinforcing member 4 onsite. For example, even if the mounting part 3a of a solar cell module 1 that has already been sold in the marketplace is thin, it is possible to reduce problems such as insufficient screw bite and the like.

Second Embodiment

Next, a solar cell module 200 according to the second of the present invention will be described in detail, using FIG. 4.

Figure 4A:
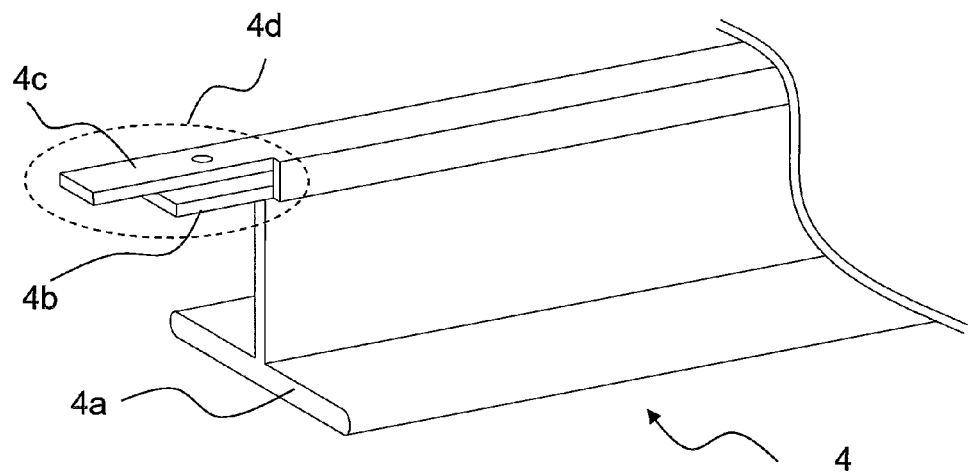
FIG. 4 is a group of drawings showing a solar cell module 200 according to a second embodiment of the present invention, FIG. 4(a) being an enlarged oblique view of the linking part of the reinforcing member in the solar cell module 200, and FIG. 4(b) being an oblique view showing the holding of the reinforcing member of FIG. 4(a) to the holding members.

The solar cell module 200 according to the present embodiment, as shown in FIG. 4(a), differs that in from the first embodiment with respect to the form of the reinforcing member 4. Specifically, the reinforcing member 4 in the solar cell module 200 is different from the reinforcing member 4 of the first embodiment in that the second member 4c is made longer in the longitudinal direction of the reinforcing member 4 than the first member 4b.

Figure 4B:
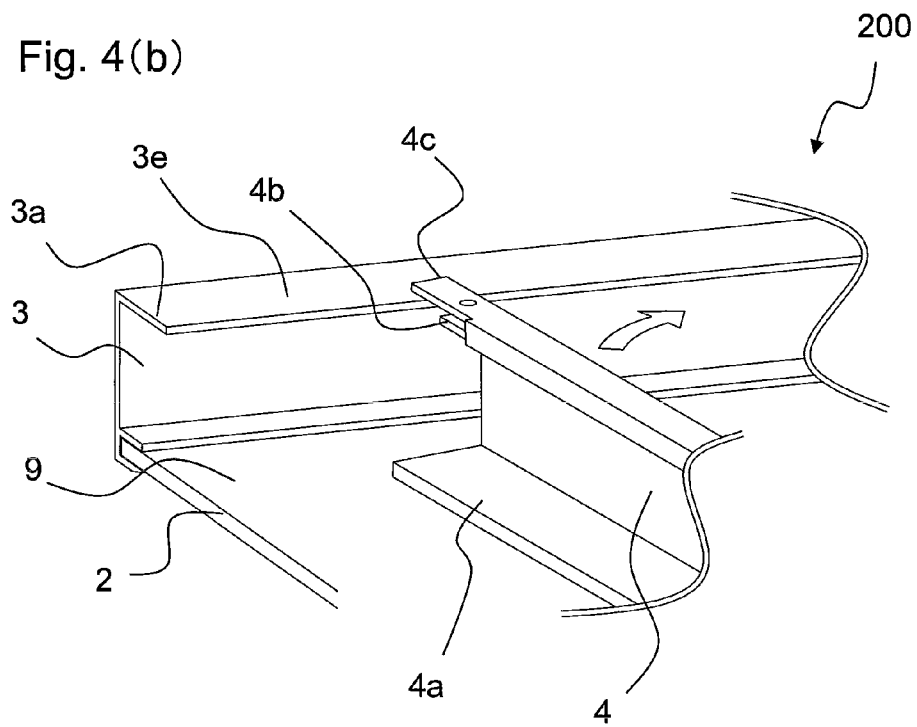

In the present embodiment, the contact surface area between the second member 4c and the second surface 3e can be made larger than the contact surface area between the first member 4b and the first surface 3d. By this type of structure, as shown in FIG. 4(b), the reinforcing member 4 can be rotated to dispose it at a prescribed fixing position while supporting the second member 4c by the second surface 3e, that is, while supporting the reinforcing member 4 with the holding members 3. For this reason, in the present embodiment, the task of mounting the reinforcing member 4 to the holding members 3 becomes easy. Therefore, it is possible to reduce problems such as damaging the rear-surface protective film 9 by a corner part of the reinforcing member 4. As a result, the productivity of the solar cell module 1 is improved.

Third Embodiment

Next, a solar cell module 300 according to the third embodiment of the present invention will be described in detail, using FIG. 5 and FIG. 14.

Figure 5A:
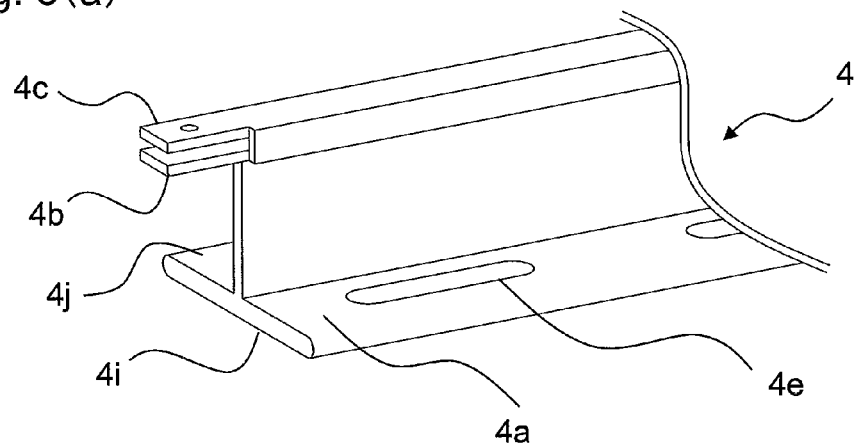
FIG. 5 is a group of drawings showing a solar cell module 300 according to a third embodiment of the present invention, FIG. 5(a) being an oblique view of the reinforcing member in the solar cell module 300, FIG. 5(b) being a cross-sectional view showing the injection of the adhesive via a through hole in the reinforcing member of FIG. 5(a), and FIG. 5(c) being a cross-sectional view showing a variation example of the solar cell module 300 that has a shock-absorbing material disposed between the reinforcing member of FIG. 5(a) and the solar cell panel.

The solar cell module according to the present embodiment, as shown in FIG. 5(a), differs from that in the first embodiment with respect to the form of the reinforcing member 4. Specifically, the reinforcing member 4 in the solar cell module 300 differs from the reinforcing member 4 in the first embodiment in that a through hole 4e is provided in the supporting part 4a of the reinforcing member 4.

In the present embodiment, the through hole 4e is provided that passes from the first main surface 4i to the second main surface 4j. At least one part of the adhesive 12 is located within the through hole 4e. By providing such a through hole 4e, it is easy to dispose the adhesive 12 in the gap between the reinforcing member 4 and the rear-surface protective film 9 that corresponds to the non-light receiving surface 2b of the solar cell panel 2.

Figure 5B:
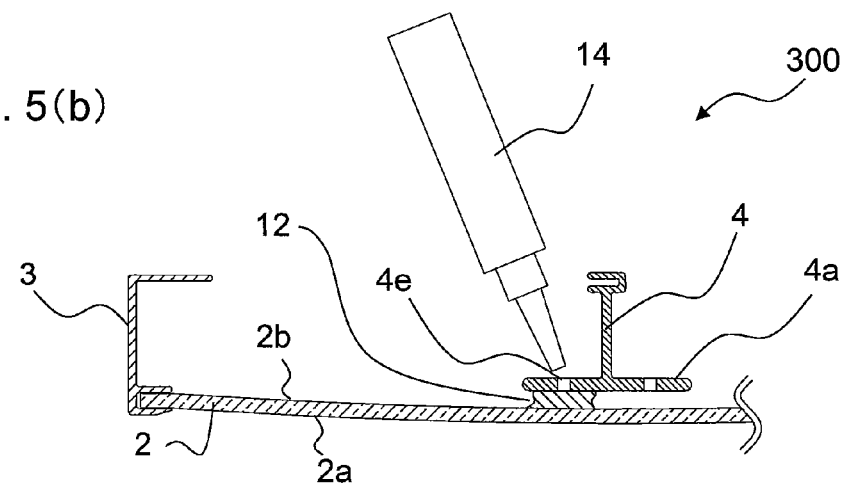

Specifically, as shown in FIG. 5(b), it is disposed by opening a gap between the supporting part 4a of the reinforcing member 4 and the non-light receiving surface 2b (rear-surface protective film 9) of the solar cell panel 2 and the fixing the holding members 3 and the reinforcing member 4 together with the screws 11. After that, by injecting the adhesive 12 from the through hole 4e in the supporting part 4a, it is possible to adhere the supporting part 4a of the reinforcing member 4 and the rear-surface protective film 9. In this case, the gap between the supporting part 4a and the rear-surface protective film 9 should be made such that an adhesive layer of the optimum thickness is formed. By injecting the adhesive 12 from the through hole 4e, at least a part of the adhesive 12 is located within the through hole 4e.

By injecting the adhesive 12 from the through hole 4e in the present embodiment in this manner, because it is possible not only to adhere along the outer periphery of the supporting part 4a, but also to adhere the rear-surface protective film 9 and the reinforcing member 4 along all of the surface portion that faces the rear-surface protective film 9 of the supporting part 4a, it is possible to improve the strength of adhesion.

Figure 3:
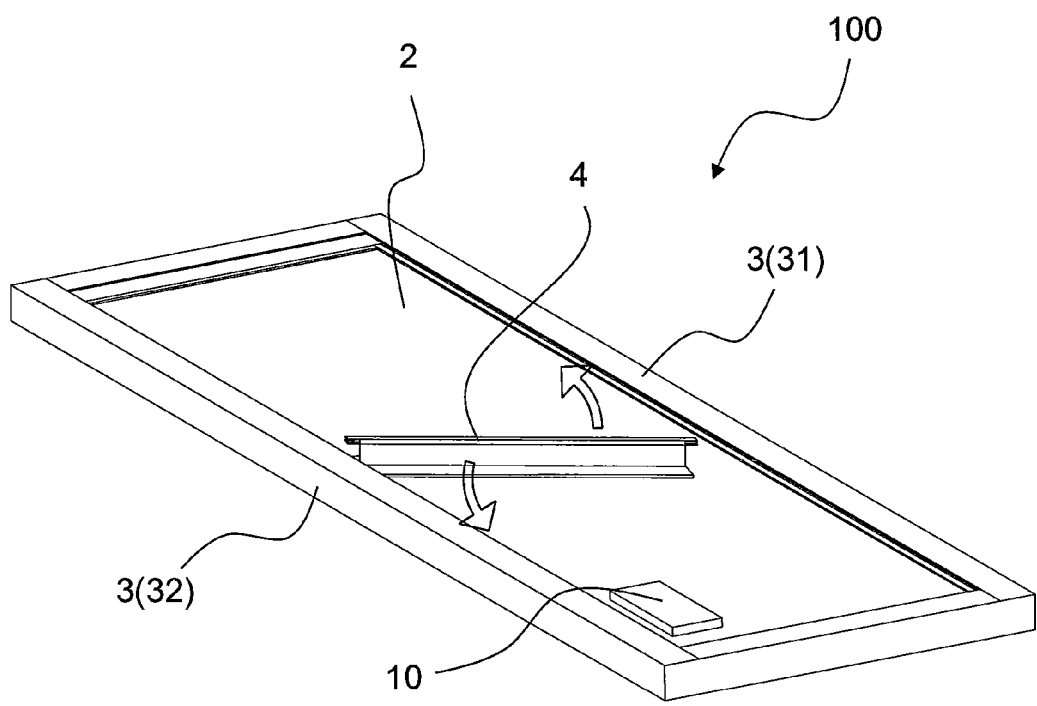
FIG. 3 is an oblique view showing the holding of the reinforcing member to the holding members in the solar cell module 100 of FIG. 1(a).

Also, in the present embodiment, even in the case in which the reinforcing member 4 is rotated to mount it, as shown in FIG. 3, it is possible to reduce the adhesive 12 spreading to the rear-surface protective film 9, thereby contaminating the solar cell panel 2 with the adhesive 12. Additionally, it is possible to reduce the occurrence of the thickness of the adhesive 12 located between the reinforcing member 4 and the rear-surface protective film 9 from becoming excessively small, enabling achievement of the desired strength of adhesion.

Figure 5C:
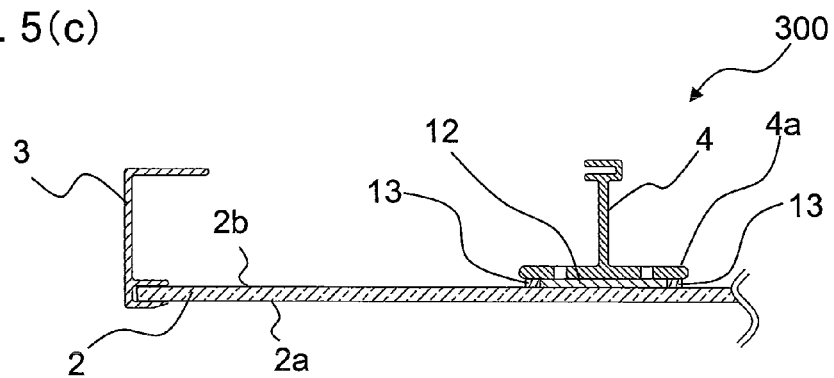

FIG. 5(c) is a drawing that shows a variation example of the solar cell module 300. In this variation example, a shock-absorbing material 13 is disposed along the edge part of the supporting part 4a, between the reinforcing member 4 and the non-light receiving surface 2b. As the shock-absorbing material 13, for example, a foam material such as ethylene propylene diene rubber or polyurethane or the like can be used. The shock-absorbing material 13 can be disposed so that it is in the compressed condition when the solar cell panel 2 is horizontal. By doing this, it is possible to reduce the oozing of the adhesive 12 into the area surrounding the reinforcing member 4, and possible to obtain an adhesive layer of the desired thickness.

Also, although the through hole 4e of the solar cell module 300 is shown as being an elongated hole as shown in FIG. 5(a), the shape of the through hole 4e is not restricted to this, and can be a round hole or a square hole. To reduce reverse flow of the adhesive 12 at the time of injection, the shape of the through hole 4e can be made a shape that matches the injection hole of a tool 14 used to inject the adhesive 12.

Figure 14A:
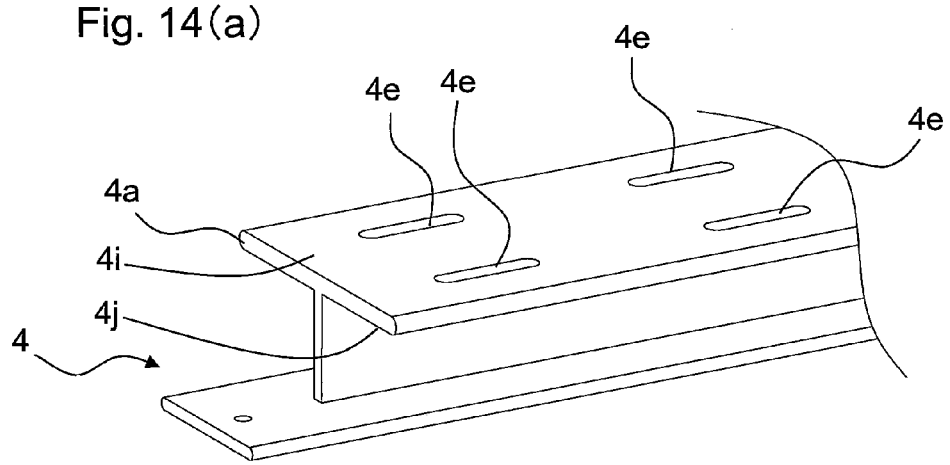
FIG. 14 is a group of drawings showing another variation example of the solar cell module 300 according to the third embodiment of the present invention, FIG. 14(a) being an oblique view of this variation example, and FIG. 14(b) being an oblique view of this variation example seen from the non-light receiving surface side.
Figure 14B:
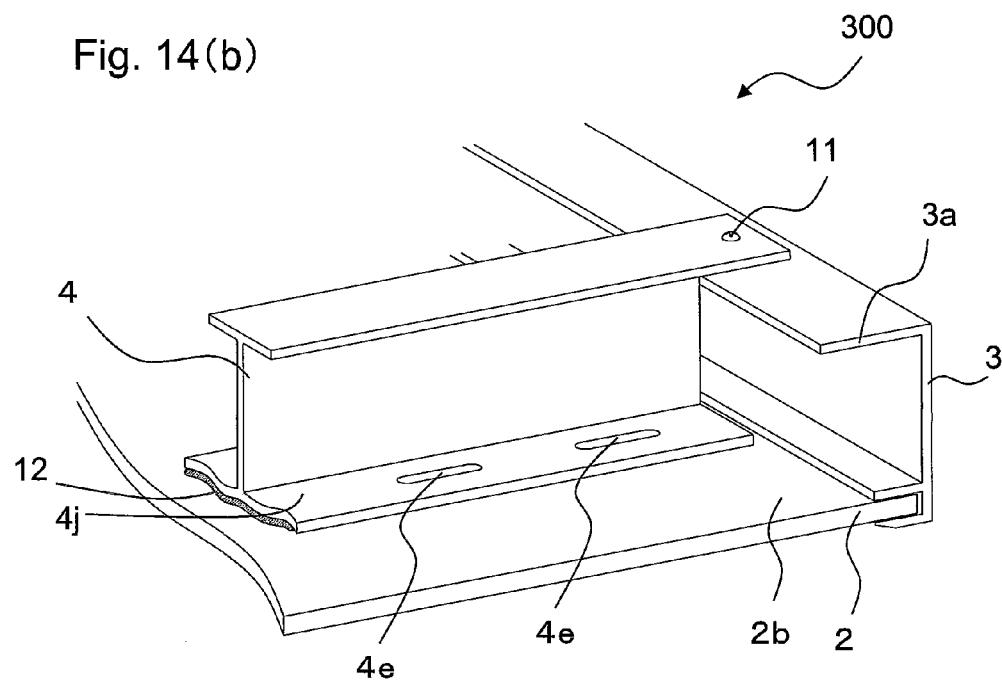

Also, another variation example of the solar cell module 300 of the third embodiment is as shown by the solar cell module in FIG. 14(a) and FIG. 14(b).

In this variation example, the supporting part 4a includes a plurality of through holes 4e in the above-described solar cell module 300 of the third embodiment. The part of the reinforcing member 4 that links with the mounting part 3a has the same shape as in the solar cell module 600 of the sixth embodiment, which is described later.

In this variation example as well, it is possible to achieve the above-described effect of providing the through hole 4e. That is, in this variation example as well, it is possible to improve the adhesion accuracy and reduce the contamination of the solar cell panel by the adhesive.

Fourth Embodiment

Next, a solar cell module 400 according to the fourth embodiment of the present invention will be described in detail, using FIG. 6.

Figure 6A:
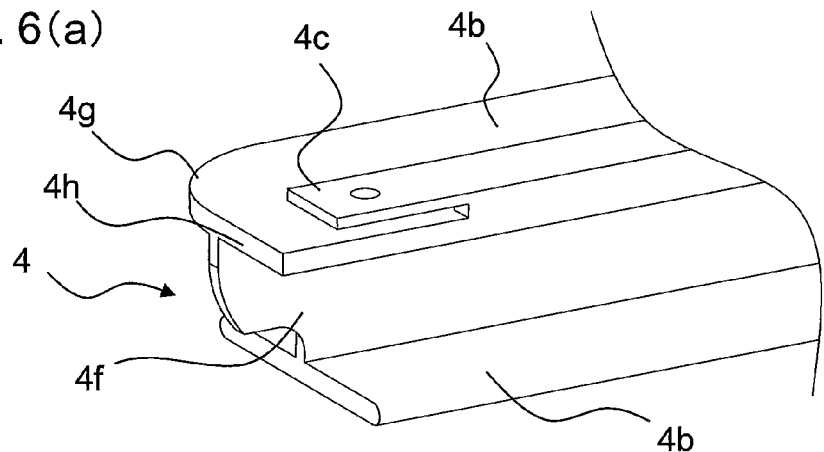
FIG. 6 is a group of drawings showing a solar cell module 400 according to a fourth embodiment of the present invention, FIG. 6(a) being an oblique view of the reinforcing member in the solar cell module 400, FIG. 6(b) being a cross-sectional view of the solar cell module 400 showing the cross-section at a position corresponding to FIG. 1(b), and FIG. 6(c) being a plan view showing the fixing of the holding members to the reinforcing member.
Figure 6B:
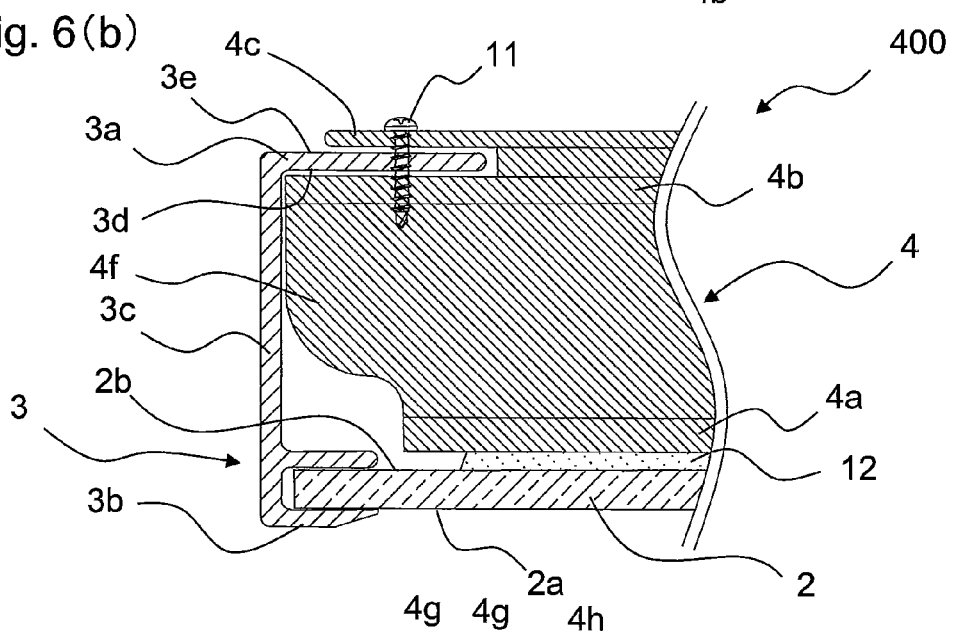
Figure 6C:
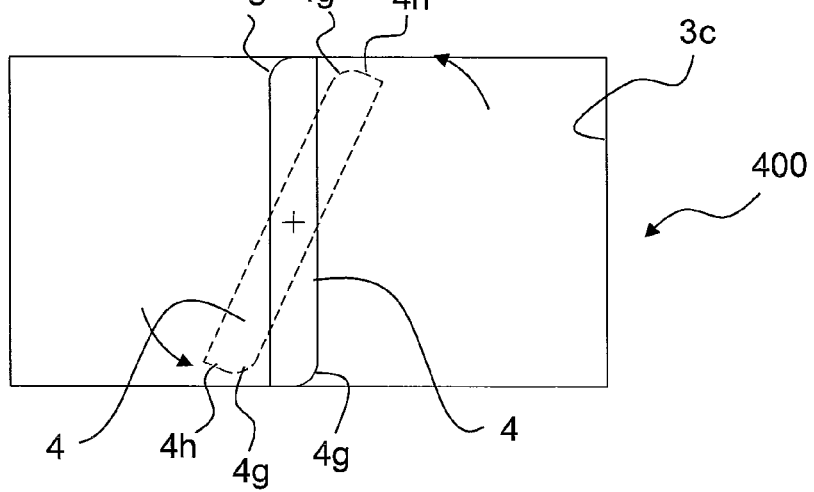

The solar cell module 400 of the present embodiment, as shown in FIG. 6(a) to FIG. 6(c), is different from that in the first embodiment in the form of the reinforcing member 4. Specifically, in the linking part 4d of the reinforcing member 4, it is different from the reinforcing member 4 in the solar cell module 100 of the first embodiment with regard to the point of both end parts located on the side of the pair of holding members 3 in the first member 4b being chamfered. Also, the term chamfering as used herein is not restricted to processing a corner part or an edge part on the ends to provide a rounding thereon, but encompasses a large cutting off of the corner part, as will be described below.

In the present embodiment, as shown in FIG. 6(a) and FIG. 6(b), the reinforcing member 4 includes a third member 4f, which is a sheet-like part that stands upright between the first member 4b and the supporting part 4a, this third member 4f approaching the wall part 3c of the holding member 3 toward the inside thereof. Also, as shown in FIG. 6(a), the reinforcing member 4 includes a cut-corner part 4g at which the corner part of the first member 4b is cut.

In this manner, the first member 4b and the third member 4f of the reinforcing member 4 approach the inside of the wall part 3c of the holding member 3. For this reason, when a positive pressure load, such as from accumulated snow, is applied to the solar cell module 1, it is possible for the mounting part 3a of the holding members 3 to securely hold the first member 4b and the third member 4f of the reinforcing member 4.

Also, because the part of the reinforcing member 4 that is supported by the mounting part 3a forms a T-shape by the first member 4b and the third member 4f, the section moduli is increased. As a result, the bending deformation of the reinforcing member 4 when a positive pressure load such as from accumulated snow is applied to the solar cell module 1 can be reduced.

Also, because first member 4b and the third member 4f of the reinforcing member 4 come closer to the inside of the wall part 3c of the holding member 3, looseness in the longitudinal direction when mounting the reinforcing member 4 is reduced, thereby providing a guide for positioning of the reinforcing member 4. As a result, quick assembly is possible, thereby enabling an improvement in productivity.

Also, because the reinforcing member 4 includes a cut-corner part 4g at which the corner part of the first member 4b is cut away, as shown in FIG. 6(c), even if the length of the reinforcing member 4 is such that it comes into contact with the wall part 3c of the holding member 3, it is easy to rotate and fix the reinforcing member 4 to the holding member 3. For this reason, this also improves productivity.

Additionally, as shown in FIG. 6(c), at both end parts of the reinforcing member 4, the cut-corner parts 4g may be provided on one pair of diagonally opposite corners, and flat parts may be provided on the other pair of diagonally opposite corners. By doing this, it is possible to reduce the excessive rotation of the reinforcing member 4 at the time of mounting, thereby further facilitating mounting and enabling an improvement in the productivity with regard to this point as well.

Fifth Embodiment

Next, a solar cell module 500 according to the fifth embodiment of the present invention will be described in detail, using FIG. 7.

Figure 7A:
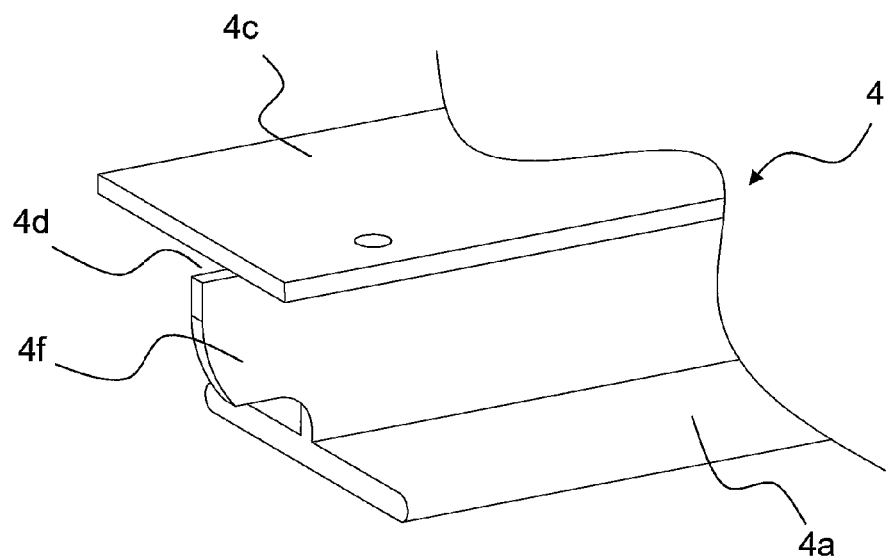
FIG. 7 is a group of drawings showing a solar cell module 500 according to a fifth embodiment of the present invention, FIG. 7(a) being an oblique view of the reinforcing member in the solar cell module 500, and FIG. 7(b) being a cross-sectional view of the solar cell module 500 showing the cross-section at a position corresponding to FIG. 1(b).
Figure 7B:
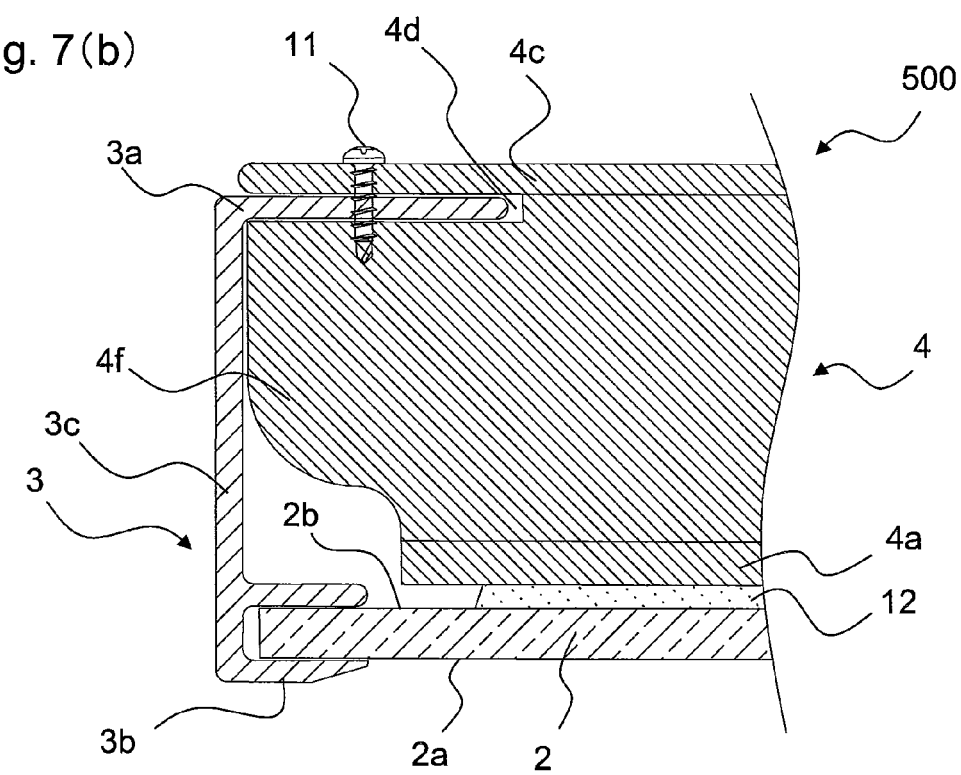

The solar cell module 500 of the present embodiment, as shown in FIG. 7(a) and FIG. 7(b), is different from that in the first embodiment in the form of the reinforcing member 4.

Specifically, as shown in FIG. 7(a) and FIG. 7(b), the reinforcing member 4 in the present embodiment does not include the part that corresponds to the first member 4b in the first embodiment. In the present embodiment, the linking part 4d is formed by cutting away a part of the third member 4f located under the second member 4c to a width that enables fitting of the mounting part 3a of the holding member 3.

By providing the linking part 4d such as this, the cross-sectional area of the reinforcing member 4 is made small, enabling a reduction in the amount of raw materials used.

Sixth Embodiment

Next, a solar cell module 600 according to the sixth embodiment of the present invention will be described in detail, using FIG. 8.

Figure 8A:
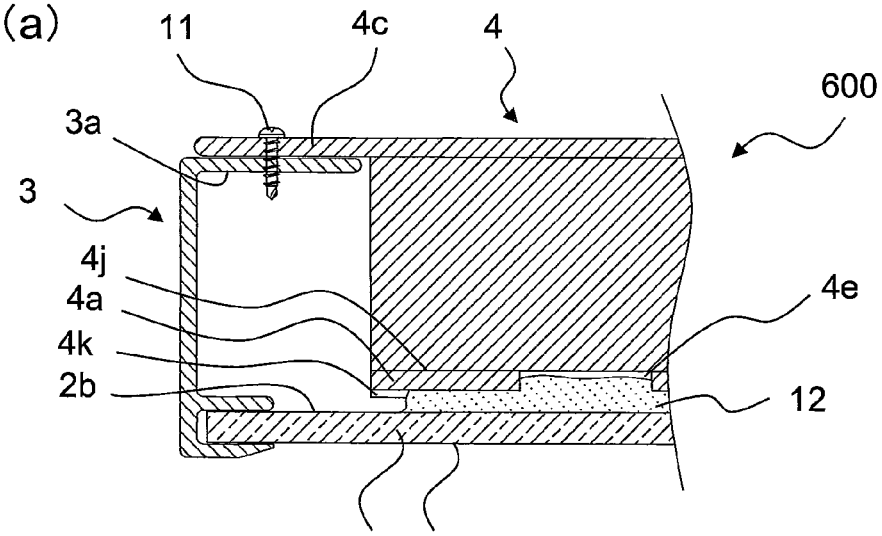
FIG. 8 is a group of drawings showing a solar cell module 600 according to a sixth embodiment of the present invention, FIG. 8(a) being a cross-sectional view of the solar cell module 600 showing the cross-section at a position corresponding to FIG. 1(b), FIG. 8(b) being an oblique view of the reinforcing member in the solar cell module 600, and FIG. 8(c) being a cross-sectional view showing a variation example of the reinforcing member.
Figure 8B:
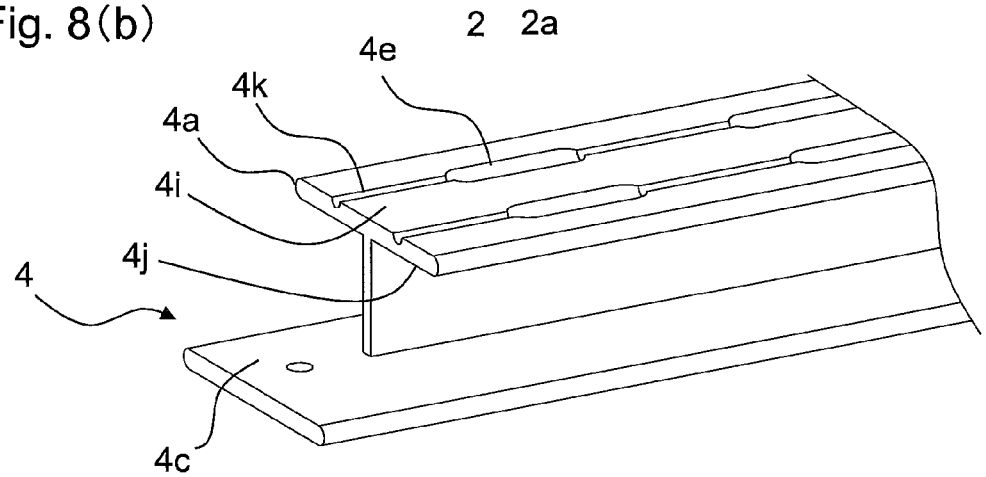

The solar cell module 600 of the present embodiment, as shown in FIG. 8(a) and FIG. 8(b), is different from that in the first embodiment in the form of the reinforcing member 4.

Specifically, as shown in FIG. 8(a) and FIG. 8(b), the supporting part 4a includes a groove part 4k opening at the first main surface 4i. The groove part 4k is provided along the longitudinal direction of the reinforcing member 4, and links with the through hole 4e. The groove part 4k passes up to the end part of the reinforcing member 4 and communicates with the outside space. Such a groove part 4k can be provided in the process of extrusion of the reinforcing member 4.

By providing the groove part 4k such as this in the first main surface 4i, the groove part 4k functions as a guide and air release for the adhesive 12, so that air bubbles do not remain in the adhesive 12 injected from the through hole 4e, and enabling the adhesive 12 to spread in the longitudinal direction of the reinforcing member 4.

In the present embodiment, although there are two groove parts 4k along the longitudinal direction of the reinforcing member 4, the form of the groove part 4k is not restricted to this. For example, the groove part 4k may be disposed in the short direction of the reinforcing member 4. In this case, the groove part 4k may be provided in a molding process or the like, separate from the process of extruding the reinforcing member 4. The number of groove parts 4k can be set as appropriate to the material and shape of the supporting part 4a. Also, in the present embodiment, although the two groove parts 4k have the same shape and the number of the linking through holes 4e is also the same, a plurality of groove parts 4k may have mutually different shapes.

Additionally, the depth of the groove part 4k is not restricted to the shallow depth such as shown in FIG. 8(b). That is, the depth of the groove part 4k in the direction perpendicular to the first main surface 4i may be appropriately set in accordance with the thickness and the like of the supporting part 4a. For example, the depth of the groove part 4k may be made one half or more of the thickness of the supporting part 4a. In this case, the through hole 4e may be provided as an opening at the bottom of the groove part 4k (not shown).

Because by providing such a groove part 4k, the adhesive 12 passes through the through hole 4e and easily spreads in the longitudinal direction of the reinforcing member 4, in addition to reducing the number of through holes 4e to improve the strength of the reinforcing member 4, it is possible to facilitate the task of injecting the adhesive 12.

Figure 8C:
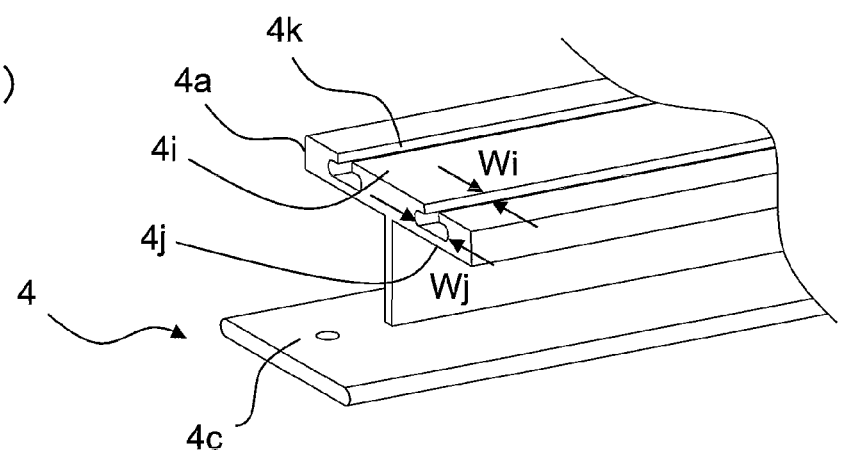

Also, the cross-sectional shape of the groove part 4k is not restricted to the section of an arc as shown in FIG. 8(b). FIG. 8(c) shows a variation example of the groove part 4k. In this variation example, the width Wj of the groove part 4k on the second main surface 4j side is larger than the width Wi of the groove part 4k on the first main surface 4i side. By the groove part 4k having this type of shape, because the adhesive 12 mates with the groove part 4k after curing, it is possible to improve the adhesion strength of the reinforcing member 4.

Also, in the present embodiment, as shown in FIG. 8(a), the holding member 3 includes a shape similar to that in the first embodiment. That is, the holding member 3 of the solar cell module 600 also includes the mounting part 3a. The reinforcing member 4 that links with the mounting part 3a, however, has a shape that is different from that of the first embodiment.

Specifically, as shown in FIG. 8(a) to FIG. 8(c), the reinforcing member 4 does not, as the linking part 4d, include the first member 4b but includes only the second member 4c. Also, the second member 4c and the mounting part 3a are held by the screw 11.

In the present embodiment, in contrast to the first embodiment, the end part of the second member 4c in the longitudinal direction is located further to the outside than the corresponding end part of the solar cell panel 2. That is, the contact surface area between the second member 4c and the second surface 3e of the mounting part 3a is made large. By doing this, the holding strength between the holding member 3 and the reinforcing member 4 is increased.

Also, in the present embodiment as well, the reinforcing member 4 may, of course, be provided with the linking part 4d having a shape that is the same as in the first embodiment.

Seventh Embodiment

Next, the solar cell module 700 according to the seventh embodiment of the present invention will be described in detail, using FIG. 9.

Figure 9A:
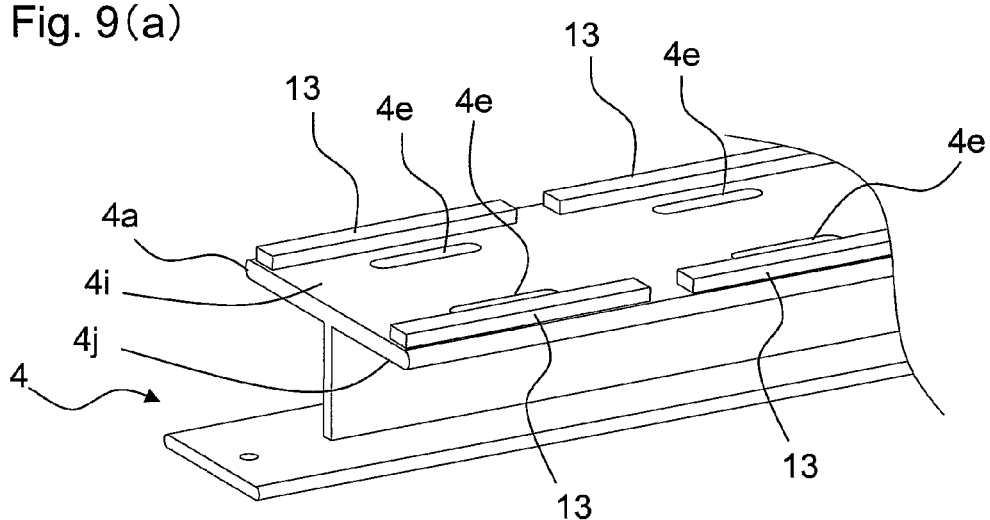
FIG. 9 is a group of drawings showing a solar cell module 700 according to a seventh embodiment of the present invention, FIG. 9(a) being an oblique view of the reinforcing member in the solar cell module 700, and FIG. 9(b) being a cross-sectional view of the solar cell module 700 seen from the non-light receiving surface side.
Figure 9B:
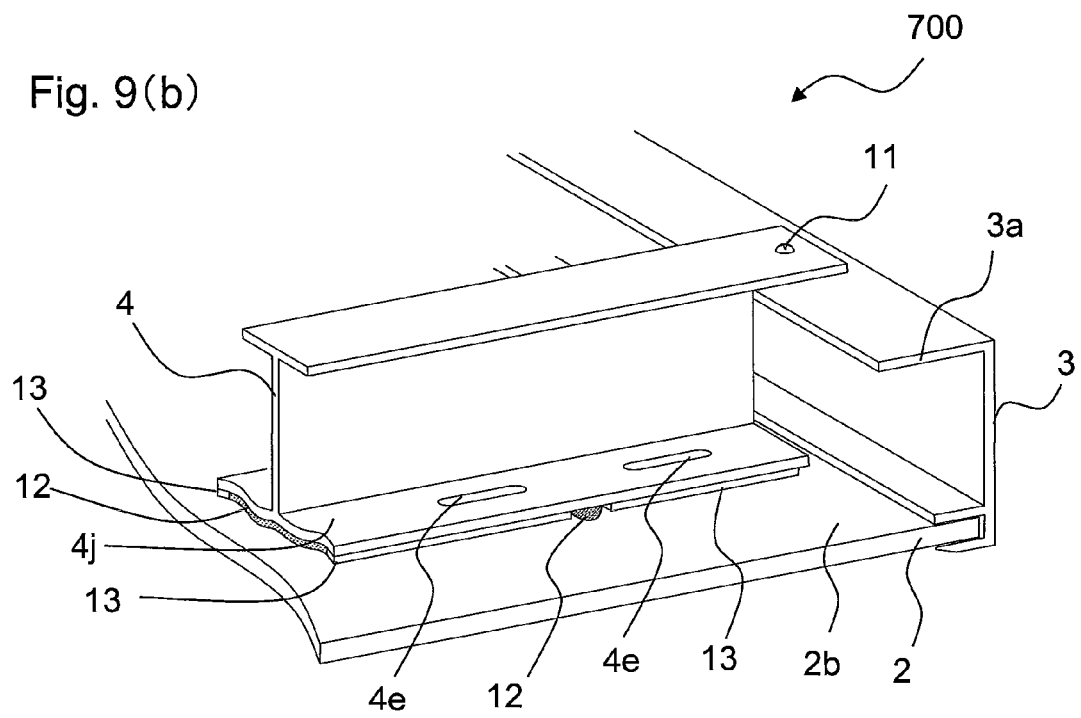

The solar cell module 700 according to the present embodiment, as shown in FIG. 9(a) and FIG. 9(b), differs from that in the third embodiment in the disposition of the shock-absorbing material 13.

Specifically, as shown in FIG. 9(a) and FIG. 9(b), the solar cell module 700 includes a plurality of shock-absorbing materials 13. The supporting part 4a is provided with a plurality of through holes 4e arranged along the longitudinal direction of the supporting part 4a. The plurality of shock-absorbing materials 13 are arranged along the outer edge part of the supporting part 4a in the longitudinal direction of the supporting part 4a and are disposed so as to be mutually spaced apart. Disposition is done so as to be adjacent to the through holes 4e, so that one shock-absorbing material 13 corresponds to one through hole 4e. Therefore, there is no shock-absorbing material 13 at a position corresponding to a location between neighboring through holes 4e in the longitudinal direction, there being breaks in the plurality of shock-absorbing materials 13.

By disposing the plurality of shock-absorbing materials 13 in this manner, the adhesive 12 that is injected from the through holes 4e spreads preferentially in the short direction rather than the longitudinal direction of the supporting part 4a, so that oozing outside from the outer edge part of the supporting part 4a is reduced. As a result, in addition to reducing adhesive 12 that does not contribute to adhesion and obtaining the desired adhesion strength, it is possible to reduce the marring of the outer appearance by oozing out of the adhesive 13 from the outer edge part of the supporting part 4a.

Also, by disposing the plurality of shock-absorbing materials 13 with a space therebetween so as to provide breaks between the shock-absorbing materials 13, these breaks function as air release holes, enabling a reduction in the number of air bubbles remaining in the adhesive 12. Additionally, by injecting the adhesive 12 until it is possible to see the adhesive 12 from these breaks, it is possible to verify that the adhesive 12 has filled the gap between the non-light receiving surface 2b of the solar cell panel 2 and the reinforcing member 4, thereby improving the accuracy of the task of adhering the reinforcing member 4.

Also, in the present embodiment, as shown in FIG. 9(a), when seen from the first main surface 4i side, the length of the shock-absorbing materials 13 in the longitudinal direction of the supporting part 4a is larger than the length of the through holes 4e. By this arrangement, the effect of reducing the preferential spreading of the adhesive 12 in the short direction as described above is heightened.

Also, as shown in FIG. 9(a), a plurality of shock-absorbing materials 13 are disposed on both ends (one end part and another end part) in the short direction of the supporting part 4a, the plurality of shock-absorbing materials 13 at one end part and the plurality of shock-absorbing materials 13 at the other end part respectively facing each other. That is, the plurality of shock-absorbing materials 13 is disposed in linear symmetry with respect to the center line in the short direction.

By such arrangement, it is possible to achieve stable adhesion of the reinforcing member 4 to the non-light receiving surface 2b, and to improve the accuracy of the adhesion position in the thickness direction of the reinforcing member 4.

Eighth Embodiment

Next, the solar cell module 800 according to the eighth embodiment of the present invention will be described in detail, using FIG. 10.

Figure 10A:
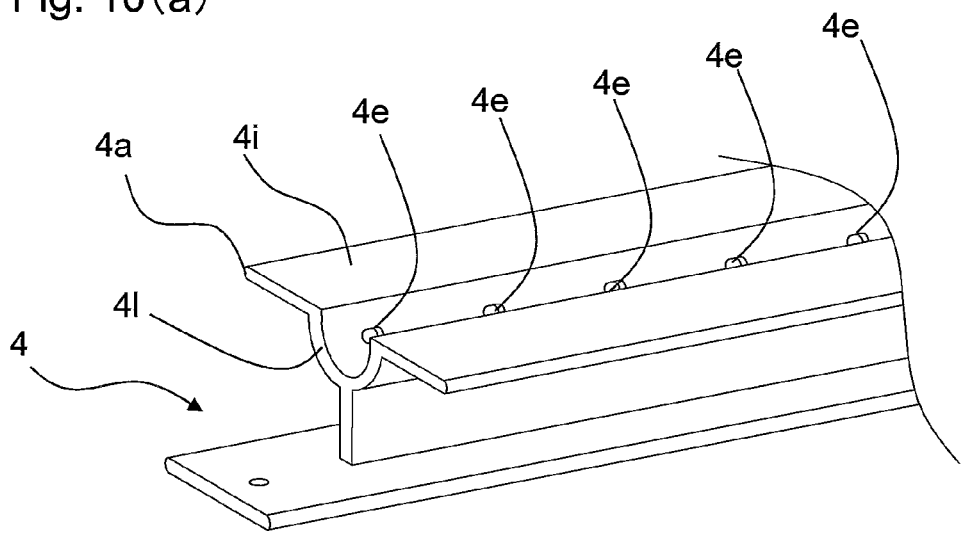
FIG. 10 is a group of drawings showing a solar cell module 800 according to an eighth embodiment of the present invention, FIG. 10(a) being an oblique view of the reinforcing member in the solar cell module 800, and FIG. 10(b) being an oblique view of the solar cell module 800 seen from the non-light receiving surface side.
Figure 10B:
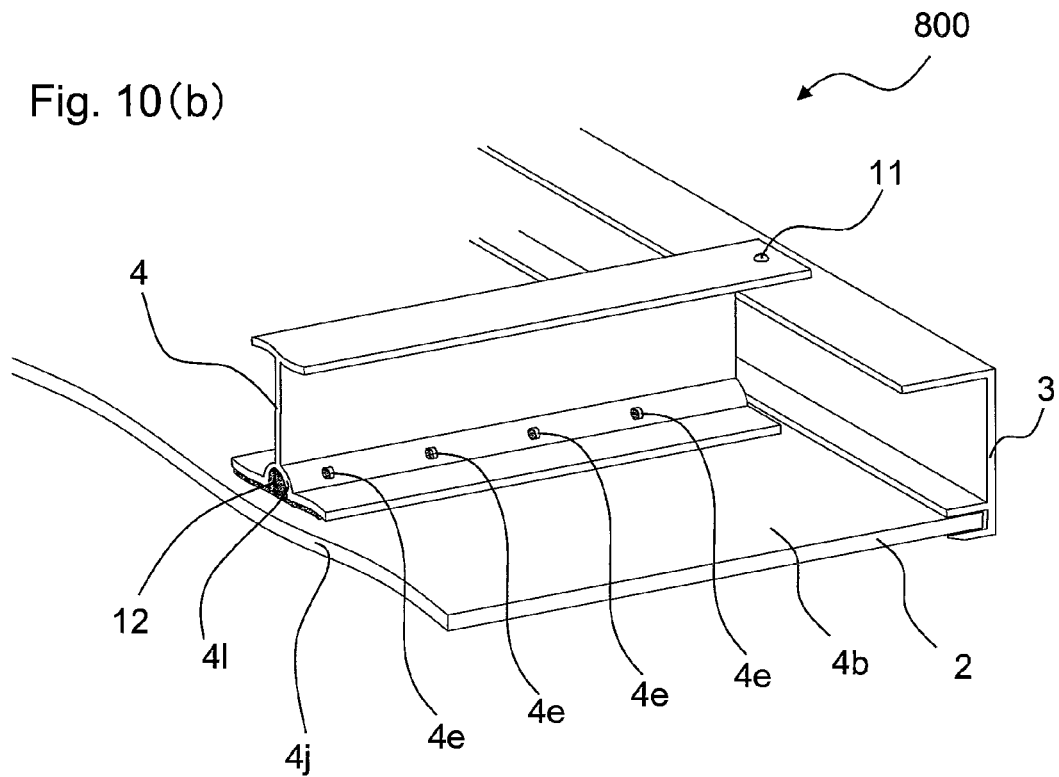

The solar cell module 800 according to the present embodiment, as shown in FIG. 10(a) and FIG. 10(b), differs from that in the sixth embodiment in the form of the supporting part 4a.

Specifically, as shown in FIG. 10(a) and FIG. 10(b), the supporting part 4a of the reinforcing member 4 includes a curved part 4l so that it is curved so as to be spaced away from the non-light receiving surface 2b. Also, the plurality of through holes 4e is provided in the curved part 4l.

Because the adhesive 12 injected from the through holes 4e has viscosity before curing, it flows easily from a narrow gap to a broad gap. In the present embodiment, by the supporting part 4a including the curved part 4l, a broad passageway for the adhesive 12 is formed on the inside of the curved part 4l. For this reason, the adhesive 12 injected from the through holes 4e preferentially spreads first in the longitudinal direction of the reinforcing member 4. The adhesive 12 spreads next in the short direction of the reinforcing member 4. The adhesive 12 that spreads in this manner fills the gap between the supporting part 4a and the non-light receiving surface 2b, and adheres the supporting part 4a to the non-light receiving surface 2b. By doing this, the adhesive 12 can be injected smoothly up to a point that is distant from the through holes 4e. As a result, the number of through holes 4e can be reduced, and the efficiency of the task of injecting the adhesive 12 can be improved.

Additionally, the curved part 4l may be located at the center part of the supporting part 4a in the direction perpendicular to the longitudinal direction thereof. By this arrangement, because it is possible to smoothly inject one layer of the adhesive 12 by the above-noted gap, there is a further improvement in the efficiency of the injection task.

Also, the center part of the supporting part 4a in the direction perpendicular to the longitudinal direction thereof as referred to herein may be defined, for example, as follows. That is, in the case in which the dimension in a direction perpendicular to the longitudinal direction of the supporting part 4a is L4a, the above-noted center part, with a middle point in the direction perpendicular to the longitudinal direction of the supporting part 4a taken as the center, may be taken as the region of L4a/2.

Ninth Embodiment

Next, the solar cell module 900 according to the ninth embodiment of the present invention will be described in detail, using FIG. 11.

Figure 11A:
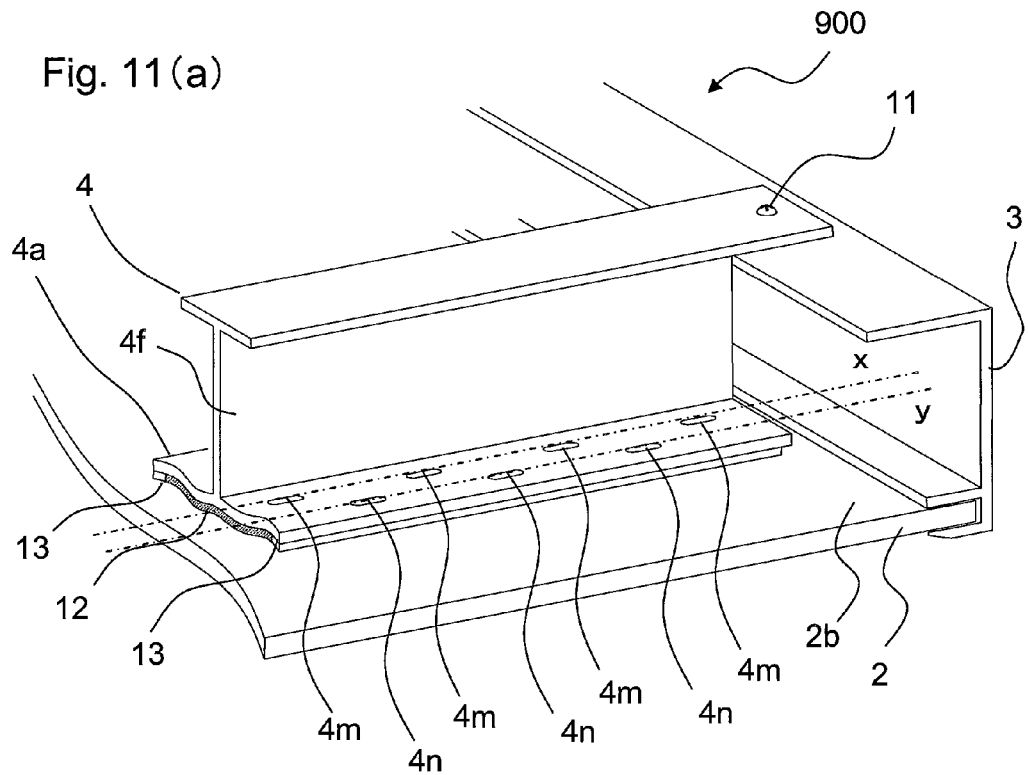
FIG. 11 is a group of drawings showing a solar cell module 900 according to a ninth embodiment of the present invention, FIG. 11(a) being an oblique view of the solar cell module 900 seen from the non-light receiving surface side, and FIG. 11(b) being an oblique view showing a variation example of the solar cell module 900.
Figure 11B:
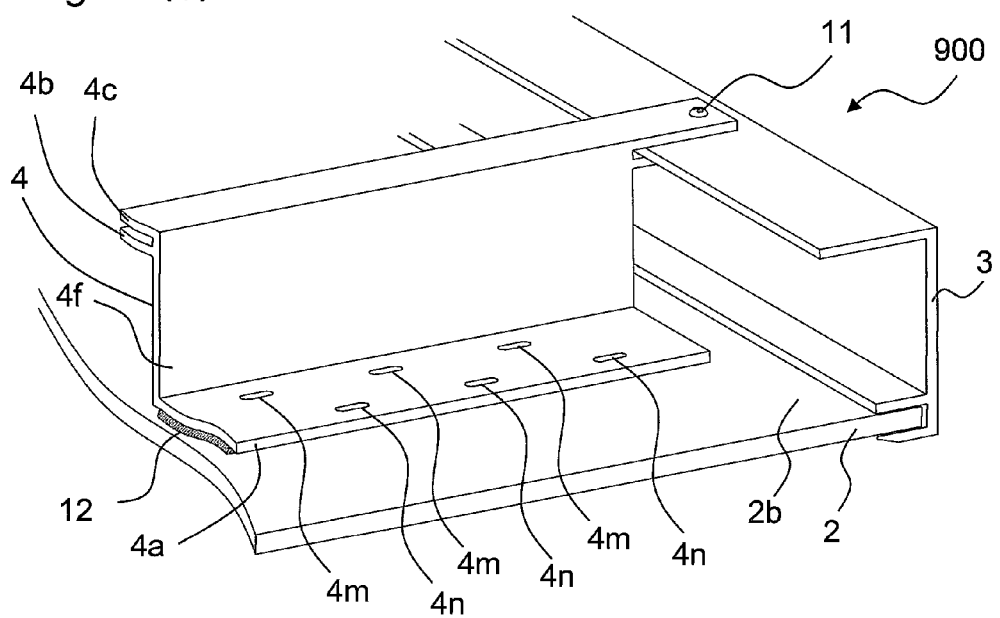

The solar cell module 900 according to the present embodiment, as shown in FIG. 11(a) and FIG. 11(b), differs from that in the sixth embodiment in the form of the supporting part 4a.

Specifically, as shown in FIG. 11(a) and FIG. 11(b), the supporting part 4 in the solar cell module 900 does not include the groove part 4k and includes a plurality of through holes.

The plurality of through holes include a plurality of first through holes 4m arranged along a first row in the longitudinal direction of the supporting part 4a, and a plurality of second through holes 4n arranged along a second row in the longitudinal direction of the supporting part 4a. Stated differently, the first through holes 4m are disposed on a first line x in the longitudinal direction, and the second through holes 4n are disposed on a second line y that is parallel to the first line x.

Also, the first through holes 4m are disposed so as to oppose the gaps between neighboring second through holes 4n. That is, the first through holes 4m and the second through holes 4n are in what could be called a staggered arrangement.

By providing the first through holes 4m and the second through holes 4n such as these, it is easy to spread the adhesive 12 injected from the first through holes 4m and the second through holes 4n over a broad surface area of the supporting part 4a, thereby increasing the adhesion strength between the reinforcing member 4 and the non-light receiving surface 2b.

Also, as described above, the cross-sectional shape of the reinforcing member 4 is not restricted to the H-shape that is show in FIG. 11(a), and can be selected as appropriate to the shape of the holding member 3 and the solar cell panel 2.

FIG. 11(b) is a drawing showing a variation example of the solar cell module 900. In this variation example as shown in FIG. 11(b), the cross-sectional shape of the reinforcing member 4 is an L-shape. That is, the supporting part 4a extends from the third member 4f only to one side in the short direction of the supporting part 4a. Also, a plurality of first through holes 4m and a plurality of second through holes 4n are provided in the supporting part 4a in the same manner as in the above-described arrangement. With this arrangement as well, it is possible to achieve the above-described effect. Also, in an arrangement such as this, when a worker injects the adhesive 12, since it is sufficient to work from only one side in the short direction of the supporting part 4a with respect to the third member 4f, it is possible to improve the efficiency of the task of injection.

Also, in such an arrangement, as shown in FIG. 11(b), the first member 4b and second member 4c that link with the holding member 3 extend from the third member 4f toward the other side in the short direction of the supporting part 4a. That is, the first member 4b and the second member 4c extend toward the opposite side from the supporting part 4a with respect to the third member 4f. By this constitution, it is possible hold the reinforcing member 4 stably to the non-light receiving surface 2b.

Tenth Embodiment

Next, the solar cell module 1000 according to the tenth embodiment of the present invention will be described in detail, using FIG. 12.

The solar cell module 1000 according to the present embodiment, as shown in FIG. 12(a) to FIG. 12(d), differs from that in the sixth embodiment in the shape of the through holes 4e.

Figure 12A:
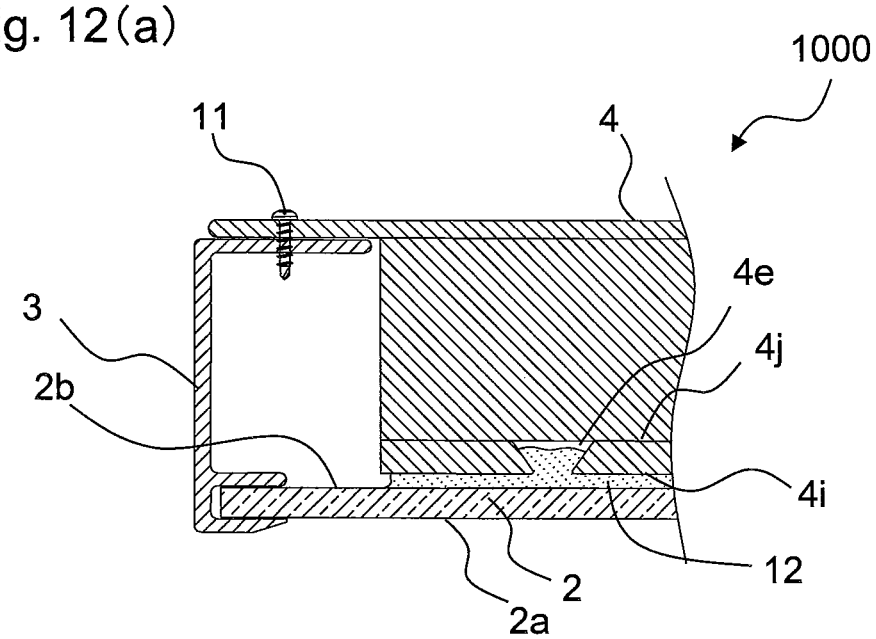
FIG. 12 is a group of drawings showing a solar cell module 1000 according to a tenth embodiment of the present invention, FIG. 12(a) being a cross-sectional view of the solar cell module 1000 showing the cross-section at a position corresponding to FIG. 1(b), FIG. 12(b) being a cross-sectional view showing a variation example of the solar cell module 1000, FIG. 12(c) being a drawing showing the injection of an adhesive 12 in the variation example shown in FIG. 12(b), and FIG. 12(d) being a cross-sectional view showing another variation example of the solar cell module 1000.

Specifically, as shown in FIG. 12(a), the shape of the through holes 4e is conical. More specifically, the shape of the through holes 4e is conical, with the aperture surface area at the second main surface 4j larger than the aperture surface area at the first main surface side 4i. By doing this, when a negative pressure acts on the solar cell panel 2, so that stress occurs that tends to pull the reinforcing member 4 and the solar cell panel 2 apart, the cured adhesive 12 within the through holes 4e and the through holes 4e mate. As a result, it is possible to increase the holding force between the reinforcing member 4 and the solar cell panel 2, and to reduce dropout of the reinforcing member 4.

A shape other than the shape shown in FIG. 12(a) may be selected as the conical shape of the through holes 4e.

Figure 12B:
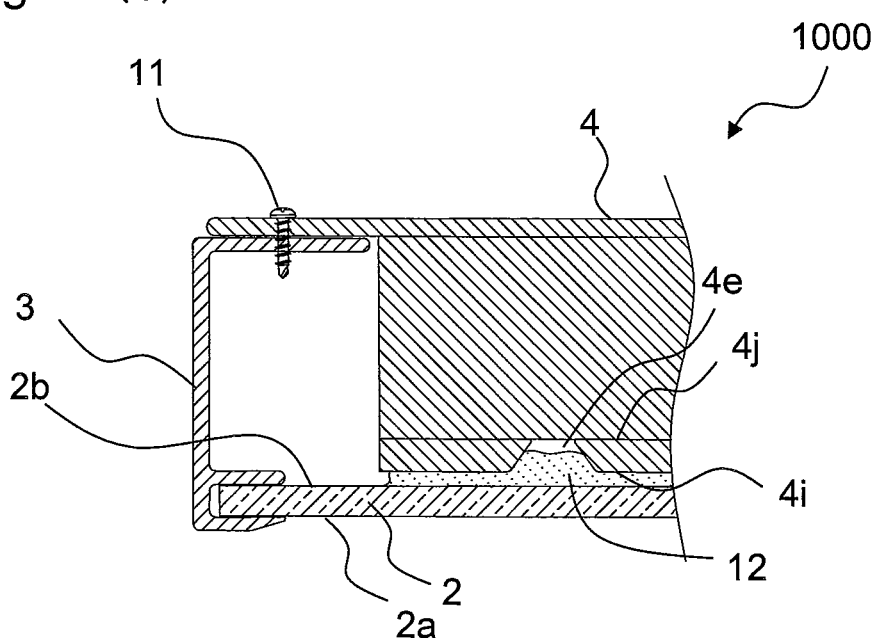
Figure 12C:
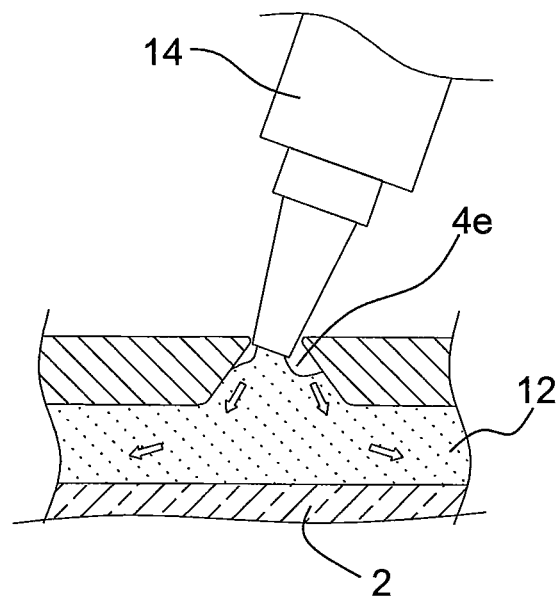

FIG. 12(b) shows a variation example of the solar cell module 1000. In this variation example, the shape of the through holes 4e is a conical shape such that the aperture surface area at the second main surface 4j is smaller than the aperture surface area at the first main surface side 4i. By doing this, as shown in FIG. 12(c), the vector of the flow of the adhesive 12 injected from a through hole 4e has a component in the direction parallel to the non-light receiving surface 2b that is larger than the component in the direction that is perpendicular to the non-light receiving surface 2b. For this reason, it is easy for the adhesive 12 injected from the through hole 4e to spread along the non-light receiving surface 2b and, as a result, it is possible to reduce the number of through holes 4e and to improve the efficiency of the task of injection.

Figure 12D:
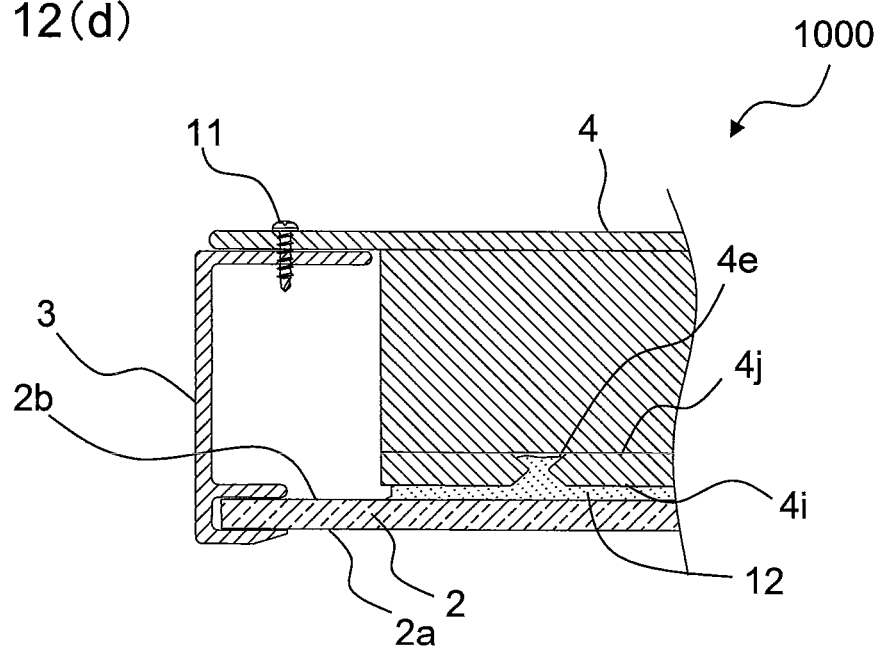

Also, FIG. 12(d) shows another variation example of the solar cell module 1000. As shown in FIG. 12(d), in this variation example, the shape of the through hole 4e is a combination of the shape of the through hole 4e shown in FIG. 12(a) and the shape of the through hole 4e shown in FIG. 12(b). That is, in this variation example, the aperture surface area of the through hole 4e at the first main surface 4i and the aperture surface area thereof at the second main surface 4j are substantially equal. Also, the surface area at an intermediate location in the passage direction of the through hole 4e is smaller than the aperture surface area at the first main surface 4i and the aperture surface area at the second main surface 4j. Therefore, the through hole 4e has a shape with a constriction in the passage direction. In an arrangement such as this, it is possible to achieve both the effect of the arrangement shown in FIG. 12(a) and the effect of the arrangement shown in FIG. 12(b), which were described earlier.

Eleventh Embodiment

Next, a solar cell module according to the eleventh embodiment of the present invention will be described in detail, using FIG. 13.

Figure 13:
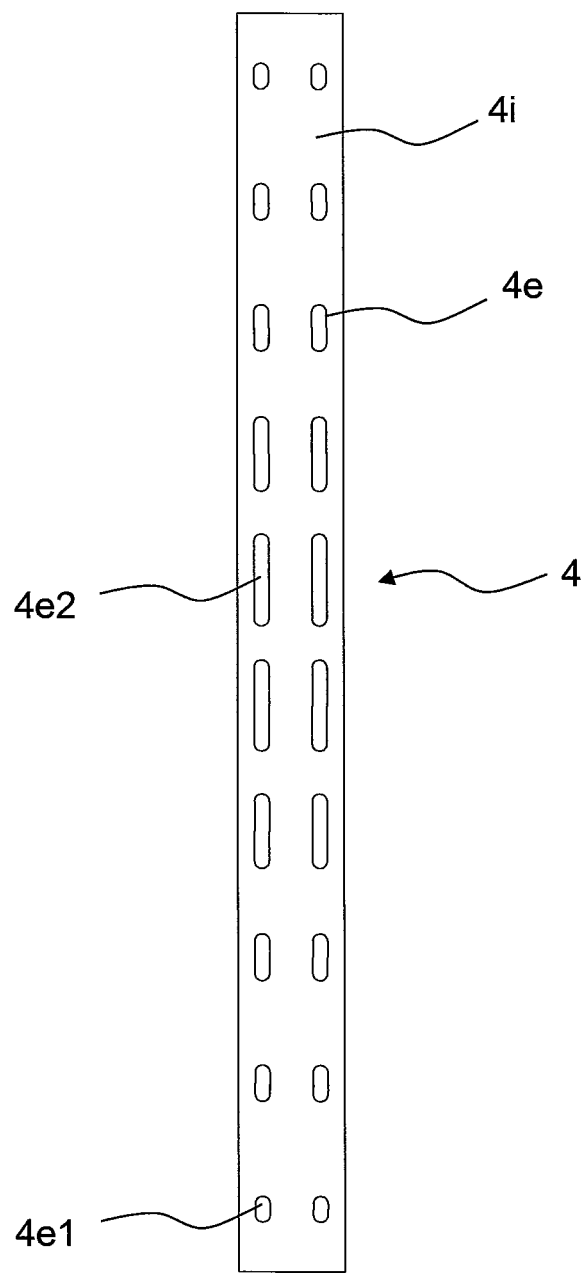
FIG. 13 is a plan view showing the reinforcing member in a solar cell module according to an eleventh embodiment of the present invention.

The solar cell module according to the present embodiment, as shown in FIG. 13, is different from the ninth embodiment in the disposition of the through holes 4e.

Specifically, the reinforcing member 4 in the solar cell module has a plurality of through holes 4e that are disposed along the longitudinal direction of the supporting part 4a. The plurality of through holes 4e include end-side through holes 4e1 and center-part through holes 4e2. The end-side through holes 4e1 are through holes 4e that approach most closely to the end part of the supporting part 4a in the longitudinal direction. The center-part through holes 4e2 are through holes 4e that are further to the inside than the end-side through holes 4e1 in the longitudinal direction of the supporting part 4a.

Also, the aperture surface area of the center-part through holes 4e2 at the first main surface 4i is larger than the aperture surface area of the end-side through holes 4e1 at the first main surface 4i. In the present embodiment, the plurality of through holes 4e have aperture surface areas that increase as they approach the center in the longitudinal direction of the supporting part 4a, and the distance between neighboring through holes 4e becomes smaller as they approach the center. That is, the plurality of through holes 4e are disposed with greater density as they approach the center in the longitudinal direction of the supporting part 4a.

In the eleventh embodiment as described above, by the through holes 4e being disposed in this manner, the adhesion surface area is greater the closer is the center and smaller the closer is the end part. By making the adhesion surface area large at the center in this manner, it is possible to increase the adhesion strength large at the center, at which a load tends to be applied, and reduce the amount of adhesive used at the end parts, where the applied loads are small. By doing this, it is possible to efficiently increase the strength of the solar cell module.

Also, in the eleventh embodiment, although the shapes of the plurality of through holes 4e are such that the aperture surface area is larger, the closer the holes are to the center in the longitudinal direction of the supporting part 4a, this is not a restriction. That is, it is sufficient that, of the plurality of through holes 4e, at least two through holes 4e may be provided so that they have the above-noted aperture surface area relationship. For example, in the case of having the above-noted aperture surface area relationship, a plurality of through holes 4e may have the same aperture surface areas as other, neighboring through holes 4e.

Also, although in the eleventh embodiment the plurality of through holes 4e are disposed with greater density the closer they are to the center in the longitudinal direction of the supporting part 4, the disposition of the plurality of through holes 4e is not restricted to this. For example, a plurality of through holes 4e may have the above-noted aperture surface area relationship but be uniformly mutually spaced, as in the eighth embodiment.

Additionally, in the eleventh embodiment, it is not necessary for the entire surface of the supporting part 4a to be adhered to the solar cell panel 2. That is, depending upon the material and shape of the reinforcing member 4, it is possible to appropriately select the region of adhesion between the supporting part 4a and the solar cell panel 2.

Also, the solar cell module to which the present invention can be applied is not restricted to having the super-straight structure as described in the foregoing embodiments, application being possible to various structures, such as a glass package construction and a substrate construction.

It will be understood that various combinations of a plurality of the above-described embodiments can be envisioned as other embodiments of the present invention.

DESCRIPTION OF THE REFERENCE SYMBOLS 100, 200, 300, 400, 500, 600, 700, 800, 900, 1000: Solar cell module
2: Solar cell panel
2a: Light-receiving surface
2b: Non-light receiving surface
3: Holding member
3a: Mounting part
3b: Fitting part
3c: Wall part
3d: First surface
3e Second surface
4: Reinforcing member
4a: Supporting part
4b: First member
4c: Second member
4d: Linking part
4e: Through hole
4e1: End-side through hole
4e2: Center-part though hole
4f: Third member
4g: Cut-corner part
4h: Flat part
4i First main surface
4j: Second main surface
4k: Groove part
4l: Curved part
4m: First through hole
4n: Second through hole
5: Translucent substrate
61: Light-receiving surface side filler material
62: Non-light receiving surface side filler material
7: Inner lead
8: Solar cell element
9: Rear-surface protective film
10: Terminal box
11: Screw
12: Adhesive
13: Shock-absorbing material
14: Tool for injecting adhesive 12

The invention claimed is:

1. A solar cell module comprising:
a solar cell panel comprising a light-receiving surface, a non-light receiving surface that corresponds to a rear surface of the light-receiving surface, and a first side part and a second side part that are located between the light-receiving surface and the non-light receiving surface;
a first holding member holding the first side part of the solar cell panel;
a second holding member holding the second side part of the solar cell panel;
a reinforcing member installed across the first holding member and the second holding member on the non-light receiving surface side; and
an adhesive, wherein
the reinforcing member comprises a supporting part bonded to the non-light receiving surface of the solar cell panel via the adhesive,
the supporting part comprises:
a first main surface located on the non-light receiving surface side and including a rear surface;
a second main surface that corresponds to the rear surface of the first main surface; and
a through hole that passes from the first main surface to the second main surface, wherein the adhesive is located within the through hole and continuously extends in an area between the non-light receiving surface and the first main surface.

2. The solar cell module according to claim 1, wherein the supporting part comprises a groove part that links with the through hole and that also opens at the first main surface.

3. The solar cell module according to claim 2, wherein the groove part communicates with an outside space.

4. The solar cell module according to claim 1, further comprising a shock-absorbing material disposed in a gap between the reinforcing member and the non-light receiving surface.

5. The solar cell module according to claim 4, wherein a plurality of the through holes are disposed along a length of the supporting part, and a plurality of the shock-absorbing materials are disposed along the length of the supporting part, respectively aligned with the plurality of through holes.

6. A solar cell module according to claim 1, wherein the supporting part comprises a curved part that is curved so as to be spaced away from the non-light receiving surface, and wherein the through hole is disposed in the curved part.

7. The solar cell module according to claim 6, wherein the supporting part includes a length and the curved part of the supporting part is located at a center part in a direction that is perpendicular to the length of the supporting part.

8. The solar cell module according to claim 1, wherein the supporting part includes a length,
a plurality of the through holes are disposed along the length of the supporting part and include an end-side through hole that is disposed so as to approach most closely to an end part of the supporting part along the length thereof, and a center-part through hole, and an aperture surface area of the center-part through hole at the first main surface is larger than an aperture surface area of the end-side through hole at the first main surface.

9. A solar cell module comprising:

a solar cell panel comprising a light-receiving surface, a non-light receiving surface that corresponds to a rear surface of the light-receiving surface, and a first side part and a second side part that are located between the light-receiving surface and the non-light receiving surface;

a first holding member holding the first side part of the solar cell panel;

a second holding member holding the second side part of the solar cell panel;

a reinforcing member installed across the first holding member and the second holding member on the non-light receiving surface side; and an adhesive disposed between the non-light receiving surface and the reinforcing member, wherein the reinforcing member comprises a supporting part that is disposed with a gap with the non-light receiving surface and that supports the non-light receiving surface of the solar cell panel via the adhesive, the supporting part comprises:

a first main surface located on the non-light receiving surface side and including a rear surface;

a second main surface that corresponds to the rear surface of the first main surface; and a through hole that passes from the first main surface to the second main surface, wherein at least one part of the adhesive is located within the through hole, wherein the first holding member and the second holding member each comprise a mounting part that protrudes inwardly in a space sandwiched between the first holding member and the second holding member and that also is linked to the reinforcing member, the mounting part comprises a first surface located on the non-light receiving surface side and including a rear surface and a second surface corresponding to the rear surface of the first surface, and the reinforcing member comprises a linking part that sandwiches the first surface and the second surface of the mounting part.

10. The solar cell module according to claim 9, wherein the linking part comprises a first member making contact with the first surface of the mounting part and a second member making contact with the second surface of the mounting part, and the contact surface area between the second member and the second surface is larger than the contact surface area between the first member and the first surface.

11. The solar cell module according to claim 10, wherein the linking part of the reinforcing member includes opposite chamfered end parts located at the first holding member side and the second holding member side of the first member.

12. The solar cell module according to claim 9, wherein the linking part comprises a first member making contact with the first surface of the mounting part and a second member making contact with the second surface of the mounting part, and the first member includes a length and the second member includes a length, and the length of the second member is longer than the length of the first member, in a direction of protrusion of the mounting part.

\* \* \* \* \*